(12) United States Patent  
Zanchi et al.

(10) Patent No.: US 8,125,270 B2
(45) Date of Patent: Feb. 28, 2012

(54) FREQUENCY OFFSET CARTESIAN FEEDBACK SYSTEM

(75) Inventors: Marta G. Zanchi, Palo Alto, CA (US); Greig C. Scott, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 337 days.

(21) Appl. No.: 12/464,010

(22) Filed: May 11, 2009

(65) Prior Publication Data

US 2010/0283538 A1 Nov. 11, 2010

(51) Int. Cl.
*H03F 1/22* (2006.01)
(52) U.S. Cl. ........... 330/69; 330/149; 330/150; 375/295
(58) Field of Classification Search .................... 330/69, 330/147, 149, 150; 375/297, 295
See application file for complete search history.

(56) References Cited

OTHER PUBLICATIONS

M.G. Zanchi, J.M. Pauly, G.C. Scott, "Frequency Offset Cartesian Feedback Control System for MRI Power Amplifier," Abstract, Proceedings of ISMRM 17th Scientific Meeting and Exhibition, Hawaii, 2009, 1 page.
M.G. Zanchi, J.M. Pauly, G.C. Scott, "Frequency Offset Cartesian Feedback Control System for MRI Power Amplifier," Power Point presented at the Proceedings of ISMRM 17th Scientific Meeting and Exhibition, Hawaii, 2009, 28 pages.
M.G. Zanchi, J.M. Pauly, G.C. Scott, "Feasibility of Active Cable Trap to Attenuate MRI-Induced RF Currents," Abstract, Proceedings of ISMRM 17th Scientific Meeting and Exhibition, Hawaii, 2009, 1 page.
Zanchi et al., "Cartesian Feedback Design: Concepts for the Attenuation of MRI-Induced RF Currents," Poster presented at the ISMRM Safetly Workshop—Lisbon, 2008, MR Safety: Update Practical Information, and Research, Jul. 2008, 1 page.
Zanchi et al., "Cartesian Feedback Design: Concepts for the Attenuation of MRI-Induced RF Currents," Abstract, ISMRM Safetly Workshop—Lisbon, 2008, MR Safety: Update Practical Information, and Research, Jul. 2008, 1 page.
J. L. Dawson, T. H. Lee, "Cartesian Feedback for RF Power Amplifier Linearization," an invited talk appearing in the Proceedings of the American Control Conference, pp. 361-366, Jun. 2004.
Zanchi et al., "Frequency-Offset Cartesian Feedback Based on Polyphase Difference Amplifiers," Not yet published—Manuscript submitted to Transaction on Circuits and Systems, Jun. 2009, 13 pages.

*Primary Examiner* — Michael Shingleton
(74) *Attorney, Agent, or Firm* — Beyer Law Group LLP

(57) ABSTRACT

An amplifier system providing improved Cartesian feedback is provided. A complex band pass error amplifier is provided. A quadrature up converter is connected to the complex band pass error amplifier so as to receive as input, output from the complex band pass error amplifier. An amplifier is connected to the quadrature up converter so as to receive as input, output from the quadrature up converter. A quadrature down converter is connected at or beyond the amplifier output so as to receive as input a signal proportional to that delivered by the amplifier as output to a load, wherein the complex band pass error amplifier is connected to the quadrature down converter so as to receive as a first input, output from the quadrature down converter and as a second input, a quadrature reference signal.

18 Claims, 15 Drawing Sheets

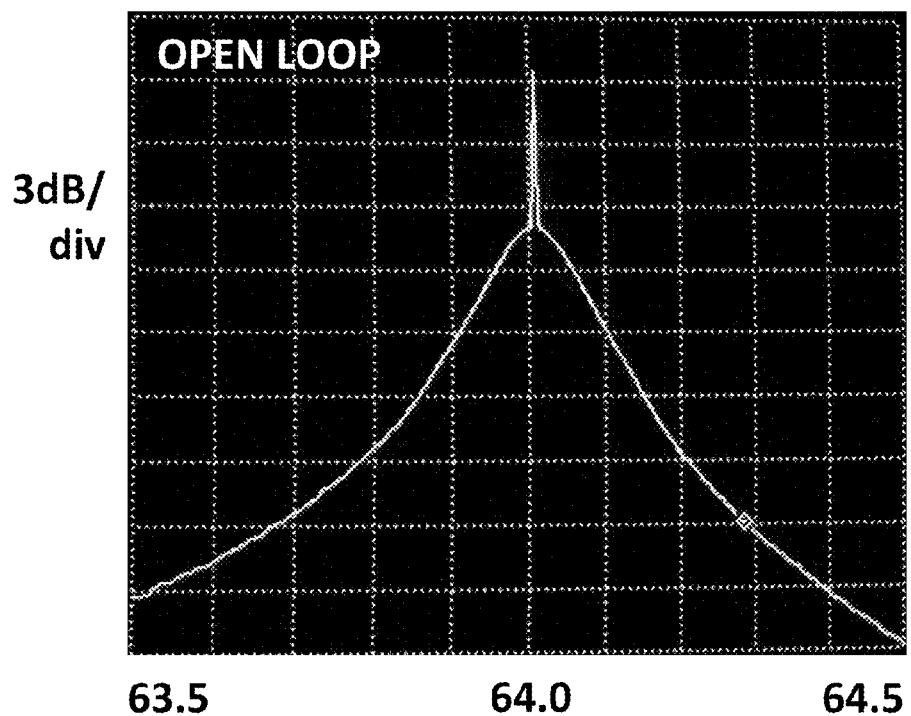
FIG. 13   Frequency [MHz]
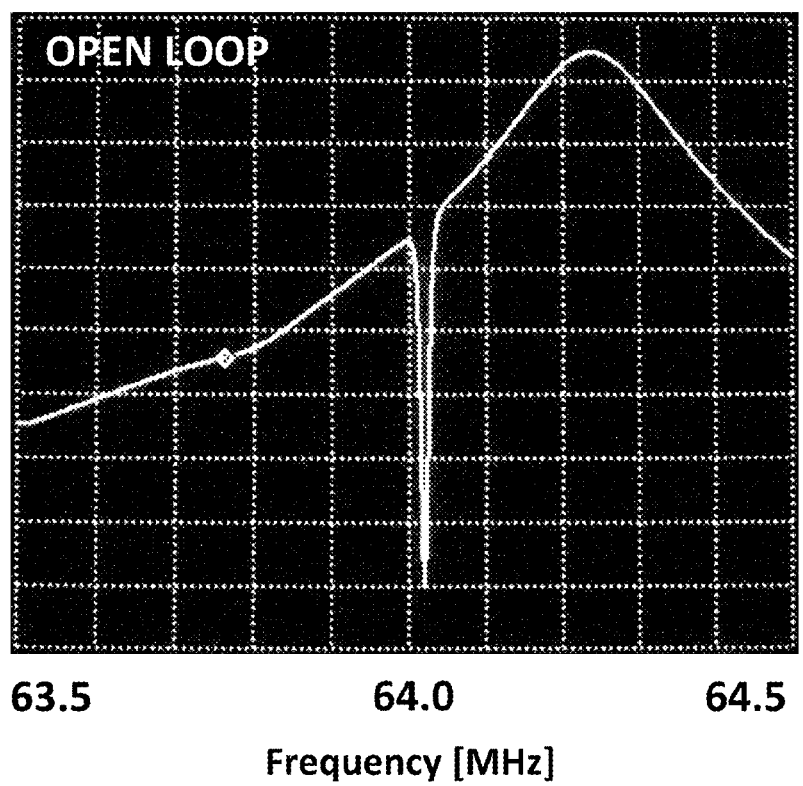
Frequency [MHz]
FIG. 14

FREQUENCY OFFSET CARTESIAN FEEDBACK SYSTEM

GOVERNMENT RIGHTS

This invention was made with Government support under contract EB008108 awarded by the National Institutes of Health and under contract EB005307 awarded by the National Institutes of Health. The Government has certain rights in this invention.

BACKGROUND OF THE INVENTION

This invention relates generally to amplifier linearization.

Radiofrequency power amplifiers are used in a wide variety of applications including, but not limited to, wireless communications and magnetic resonance imaging (MRI). The specifications for such diverse applications are different, but they have one common denominator: the need to maximize both the efficiency and linearity of increasingly powerful amplifiers. In the field of communications, linearity is demanded by the desire for high spectral efficiency, that is, the ability to transmit data at the highest possible rate for a given channel bandwidth. In the field of MRI, it is the increasingly popular use of arrays of coils to challenge the linearity of the power amplifiers driving these coils, because of the complex interactions between coils that change the load conditions (and induced output currents) significantly and unpredictably.

Many different linearization techniques have been proposed to deal with these challenges. Among them, Cartesian feedback has been proposed in both fields and has received a great deal of attention thanks to the great advantage that it does not require a detailed knowledge of the power amplifier behavior and is immune to its changes, such as those due to temperature and aging.

Classic Cartesian Feedback

Cartesian feedback is a method of linearizing highly-efficient nonlinear radio-frequency (RF) amplifiers. The basic principle of a Cartesian Feedback system is shown in FIG. 1. The quadrature baseband inputs, usually termed i and q components, form the reference signals for the loop. The forward path consists of the difference amplifiers, the synchronous up-mixer, the non-linear amplifier, and the output load (usually, but not always, an antenna). The difference amplifiers are characterized, to first order approximation, by the transfer function $H_C(\omega)$ that describes the relationship between the complex output I+jQ and the complex input i+jq:

$$H_C(\omega) = \frac{K}{1 + j\left(\frac{\omega}{\omega_O}\right)}$$

The feedback path consists of a coupler that sends a sample of the power amplifier output voltage (or current or linear combination thereof) to the synchronous down-mixer. The quadrature baseband components that result from this down-conversion are used as feedback signals and compared (subtracted) to the reference signals at the input of the difference amplifiers. The up-converted output of these amplifiers (the loop error signal) is thus the pre-distorted signal necessary to drive and linearize the power amplifier.

The last indispensable component of a Cartesian feedback system is the phase shifter. Synchronism between the up- and down-mixers is obtained by splitting a common RF carrier (the local oscillator, or LO, frequency), however the delays through the feedback and forward paths cause the reference and feedback signals to be phase misaligned, a situation that compromises the stability of the system. The phase shifter is thus necessary to compensate for the delays and maintain the correct relationship that guarantees the loop stability.

While there is a strong theoretical motivation to pursue Cartesian feedback, its penetration has been held back by the complexities associated with the actual implementation of the system. Issues such as the impact of phase misalignment on stability, phase and amplitude quadrature errors (particularly in the down-converter of the feedback path), and DC-offsets (particularly at the output of the multipliers and at the input of the difference amplifiers, also called error amplifiers) have been and still are the subject of many studies. The limit imposed by the accuracy of the down-conversion is fundamental to linearization strategies, as errors in the feedback path cannot be compensated by the loop operation and further complicate the analysis of the phase alignment control problem. DC-offsets also impact the quality of the output baseband spectrum.

SUMMARY OF THE INVENTION

In accordance with the invention, an amplifier system providing improved Cartesian feedback is provided. A complex band pass error amplifier is provided. A quadrature up converter is connected to the complex band pass error amplifier so as to receive as input, output from the complex band pass error amplifier. An amplifier is connected to the quadrature up converter so as to receive as input, output from the quadrature up converter. A quadrature down converter is connected at or beyond the amplifier output so as to receive as input a signal proportional to that delivered by the amplifier output to a load, wherein the complex band pass error amplifier is connected to the quadrature down converter so as to receive as a first input, output from the quadrature down converter and as a second input, a quadrature reference signal.

In another manifestation of the invention a method for providing linearized Cartesian feedback amplification is provided. A quadrature reference signal is provided as input to a complex band pass error amplifier. Output from the complex band pass error amplifier is provided to a quadrature up converter. The output from the complex band pass error amplifier is up converted by a factor. Output from the quadrature up converter is provided to an amplifier, which amplifies the output from the quadrature up converter. A signal proportional to a signal delivered by the amplifier to a load is received as input to a quadrature down converter. The input signal is down converted to a low intermediate frequency and scaled by a gain factor. The down converted input signal is provided as input to the complex band pass error amplifier.

The invention and objects and features thereof will be more readily apparent from the following detailed description and appended claims when taken with the drawings.

BRIEF DESCRIPTION OF THE DRAWINGS

FIG. 13 is a graph of a measured open loop gain of the prior art Cartesian feedback system without DC trimming.

FIG. 14 is a graph of a measured open loop gain of Cartesian feedback system with an embodiment of the invention employing AC coupling inside the feedback but without DC trimming.

DETAILED DESCRIPTION OF ILLUSTRATED EMBODIMENTS

Figure 1:
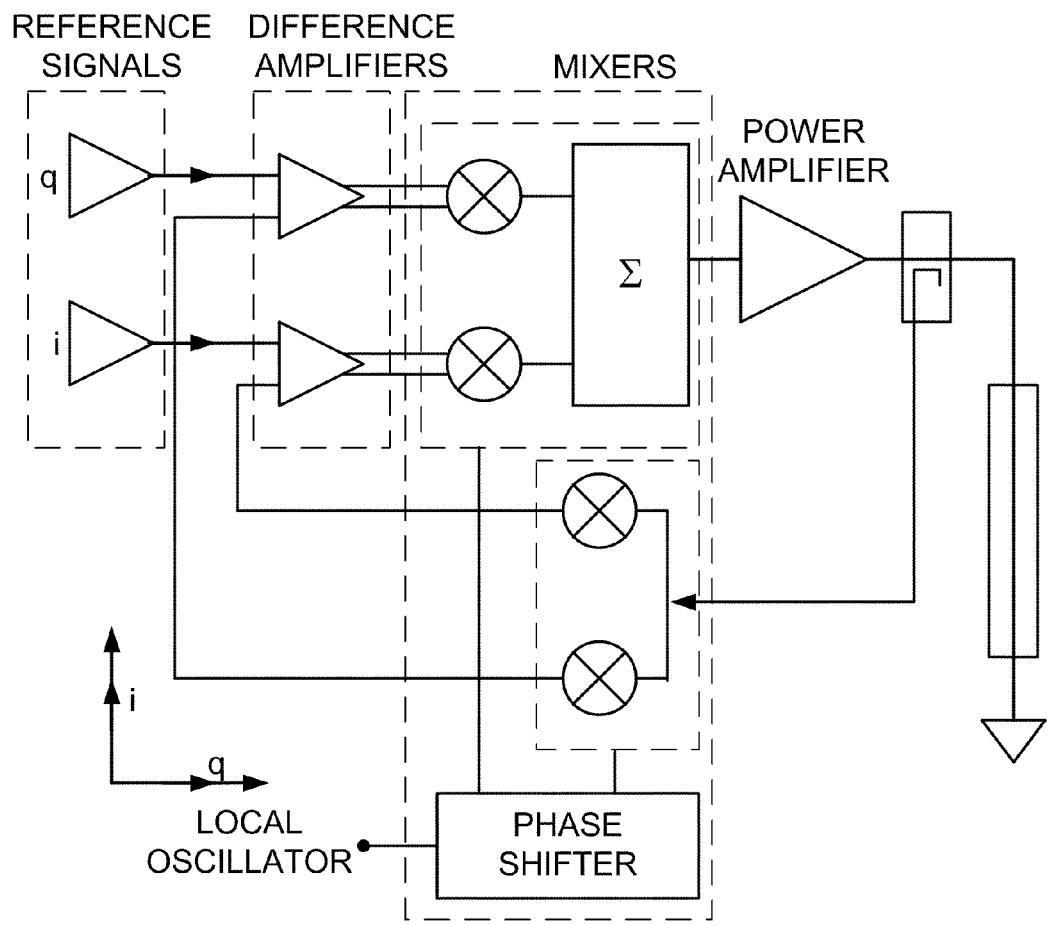
FIG. 1 is a schematic view of a Cartesian feedback system of the prior art.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One of the major challenges designers of Cartesian feedback systems face is that this method is especially sensitive to phase and amplitude quadrature errors in the mixers and to DC-offsets. The impact that these non-idealities have on the system performance is twofold: they may cause undesired frequencies to be present at the output spectrum of the power amplifier; they complicate and may even prevent the phase alignment control and, thus, the stability of the system.

To understand how undesired frequencies are created in the output spectrum by quadrature errors, let $i_f(t)$ and $q_f(t)$ be the baseband feedback quadrature signals (sent by the down-mixer to the difference amplifiers); let the reference signals be null, the difference amplifiers unity-gain, and the up-mixer error-free. If the down-mixer introduces a phase quadrature error $\phi$, then $$i_f(t) = A(t)\cos\left(\omega_B t + \frac{\varphi}{2}\right)$$

$$q_f(t) = A(t)\sin\left(\omega_B t - \frac{\varphi}{2}\right)$$

and the drive signal to the power amplifier is:

$$S_{RF}(t) = i_f(t)\sin(\omega_{LO}t) + q_f(t)\cos(\omega_{LO}t)$$
$$= A(t)\{\sin[(\omega_{LO} + \omega_B)t]\cos\left(\frac{\varphi}{2}\right)\} ++$$
$$A(t)\{-\cos[(\omega_{LO} - \omega_B)t]\sin\left(\frac{\varphi}{2}\right)\}$$

If $\phi$ is null, then $S_{RF}$ contains only the desired frequency $\omega_{LO}+\omega_B$; otherwise, a so-called image (or ghost) frequency $\omega_{LO}-\omega_B$ also modulates the input of the power amplifier.

Since the non-ideality responsible for this unwanted behavior is in the feedback path, the theory of control loop systems teaches us that it will not be compensated by the loop operation. For the image rejection ratio (the ratio of the amplitudes of the desired and image frequencies) to be at least 40 dB, it can be shown that the maximum value of the phase error $\phi$ is 1.15°. Similarly, the maximum value of amplitude imbalance to obtain the same image rejection ratio is 2%. DC-offsets also result in the appearance of unwanted signals, specifically at the local oscillator (LO) frequency, at the input of the power amplifier. The presence of this particular undesired frequency is known as LO-leakage.

Frequency-Offset Cartesian Feedback

To address the problems that phase and amplitude quadrature errors and DC-offsets associated with the imperfections of the mixers and other blocks of the system introduce, an embodiment of the invention provides a modification to the classic Cartesian feedback architecture that may be provided specifically in the context of control of power amplifiers for magnetic resonance imaging (MRI), but generally applicable to the problem of Cartesian feedback control of any RF power amplifier.

The modification consists in substituting a complex band pass error amplifier, such as polyphase difference amplifiers, for the classic pair of difference amplifiers of the Cartesian feedback system. The net result of this change is to move the loop control bandwidth away from both the DC (at baseband) and the local oscillator frequency (at RF), so that the undesired frequencies that would be created by both quadrature errors and DC-offsets are outside this bandwidth. By doing so, quadrature errors and offsets of the loop blocks need not to be minimized by careful designs, but are prevented from causing those effects that may impair the performance of the Cartesian feedback system.

Figure 2A:
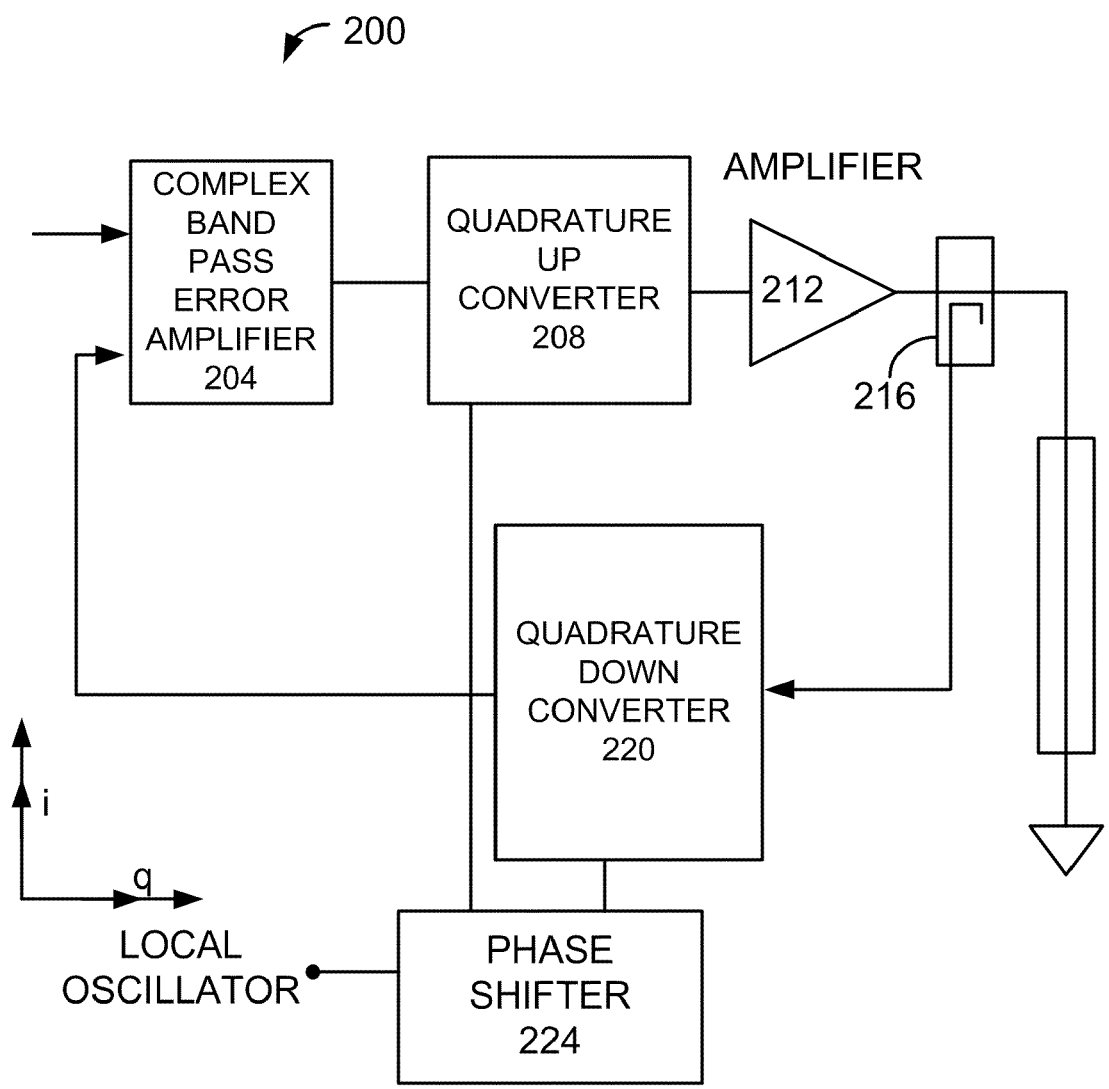
FIG. 2A is a schematic view of a Cartesian feedback system according to an embodiment of the invention

FIG. 2A is a schematic diagram of an embodiment of the invention, which provides an improved amplifier system 200 with Cartesian feedback. A complex band pass error amplifier 204 is provided. Such a complex band pass error amplifier 204 is defined as an amplifier that does not have both an even amplitude and odd phase response centered on DC. Therefore, the complex band pass error amplifier does not have an even amplitude response and/or does not have an odd phase response centered on DC. In a preferred embodiment, the complex band pass error amplifier 204 is a cross coupled polyphase amplifier. The complex band pass error amplifier is connected to a quadrature up converter 208, as shown, so that the output of the complex band pass error amplifier 204 is used as input to the quadrature up converter 208. The quadrature up converter 208 is connected to an amplifier 212, as shown, in such a way so that the output from the quadrature up converter 208 is used as input to the amplifier 212. In a preferred embodiment, the amplifier 212 is a power amplifier. A coupler 216 samples the output of the amplifier 212. The sampled output from the coupler 216 is used as input to a quadrature down converter 220.

The coupler 216 may be a wire or other device for sampling output from the amplifier 212. A coupler is any device that delivers an output signal that is linearly related to the amplifier output. Coupling devices include transformers, directional couplers providing forward and/or reverse wave amplitudes, or simple voltage dividers tapping a transmission line. A transformer can be as simple as an inductive pickup loop sensing the field in a transmission line.

The coupler 216 provides a connection between the amplifier 212 output and the quadrature down converter 220 to sample the amplifier output to the load. As shown, the quadrature down converter 220 is connected at or beyond the amplifier output, through the coupler, so as to receive as input a signal proportional to that delivered by the amplifier output to the load (sampled output). The complex band pass error amplifier 204 is connected to the quadrature down converter 220, as shown, in such a way so as to receive as one input, output from the quadrature down converter 220, and as a second input, a quadrature reference signal, as shown. In a preferred embodiment, local oscillator (LO) provides input to a phase shifter 224. In other embodiments other frequency sources such as a voltage controlled oscillator (VCO) or a waveform generator may be used in place of a LO. In other embodiments the phase shifter may be replaced by multiple local oscillators or other devices that make the loop stability possible. The phase shifter 224 has two outputs connected to the quadrature down converter 220 and quadrature up converter 208 to provide the frequency mixing inputs to the quadrature down converter 220 and the quadrature up converter 208.

Figure 2B:
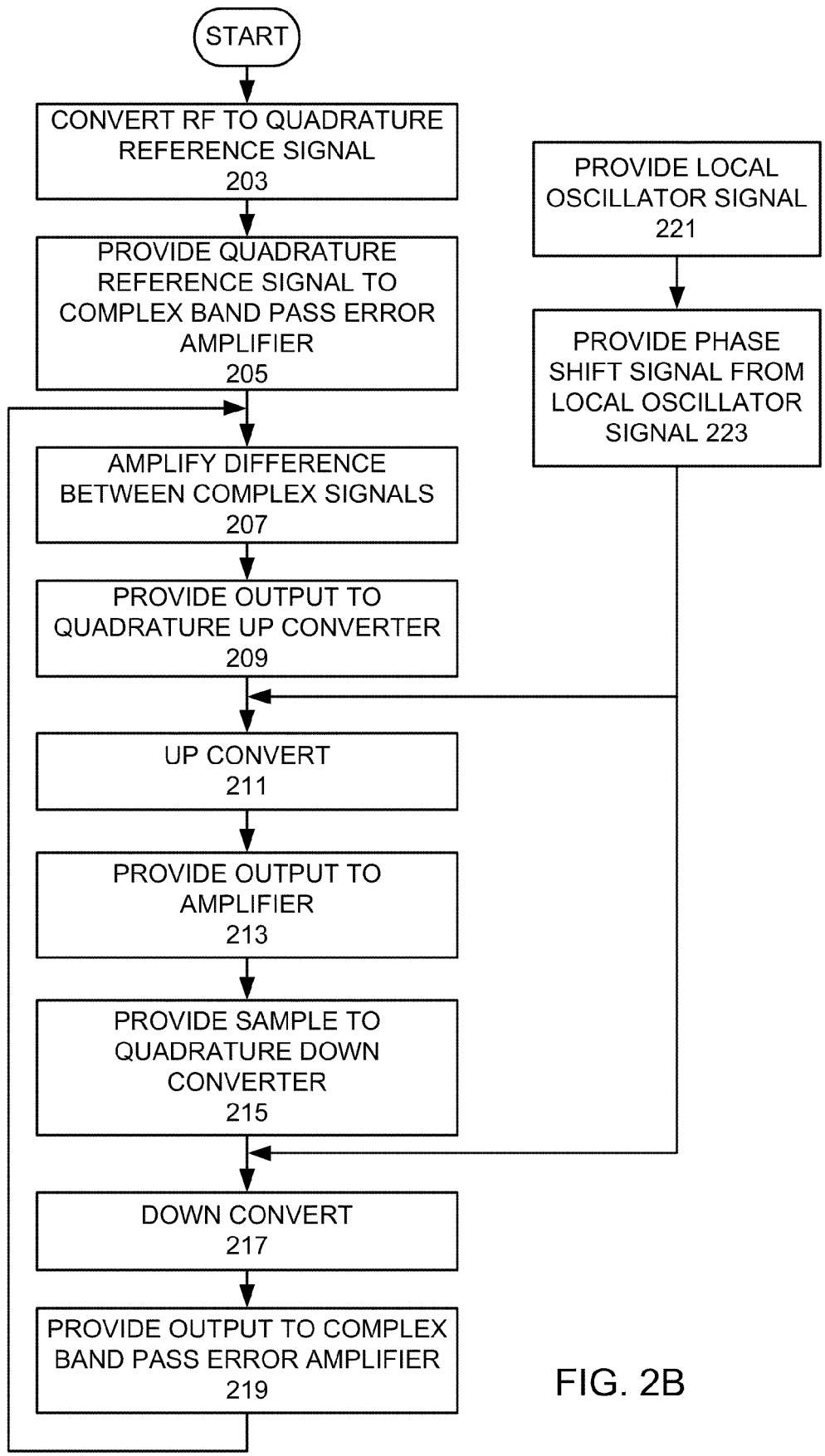
FIG. 2B is a flow chart of a method that uses the Cartesian feedback system of FIG. 2A

FIG. 2B is a high level flow chart of a process for one embodiment of using the device shown in FIG. 2A. A quadrature demodulator combined with image reject filter form an image reject mixer which is used to convert an RF signal to a quadrature reference signal (step 203). The quadrature reference signal is provided as input to the complex band pass error amplifier 204 (step 205). The complex band pass error amplifier 204 amplifies the difference between the quadrature reference signal and the input from a down converter (step 207). Output from the complex band pass error amplifier 204 is provided as input to the quadrature up converter 208 (step 209). The output from the complex band pass error amplifier is up converted and scaled by a gain factor by the quadrature up converter 208 (step 211). Output from the quadrature up converter 208 is provided as input to the amplifier 212 (step 213), which amplifies the output from the quadrature up converter 208. A signal proportional to the signal delivered by the amplifier as output to the load is provided as input to the quadrature down converter 220 (step 215). The input signal is down converted (step 217). The down converted signal is provided as input to the complex band pass error amplifier 204 (step 219). A local oscillator provides a signal (step 221). A phase shifter 224 receives the signal from the local oscillator and provides it as input to the quadrature up converter 208 and the quadrature down converter 220 (step 223). The up converter output frequency is the sum of the phase shifted local oscillator signal and the polyphase output frequency, whereas the down converter output frequency is the difference between the amplifier sampled output and the phase shifted local oscillator signal.

SPECIFIC EXAMPLES

As mentioned above, in a preferred embodiment of the invention, the complex band pass error amplifier is a cross coupled polyphase amplifier.

Figure 3:
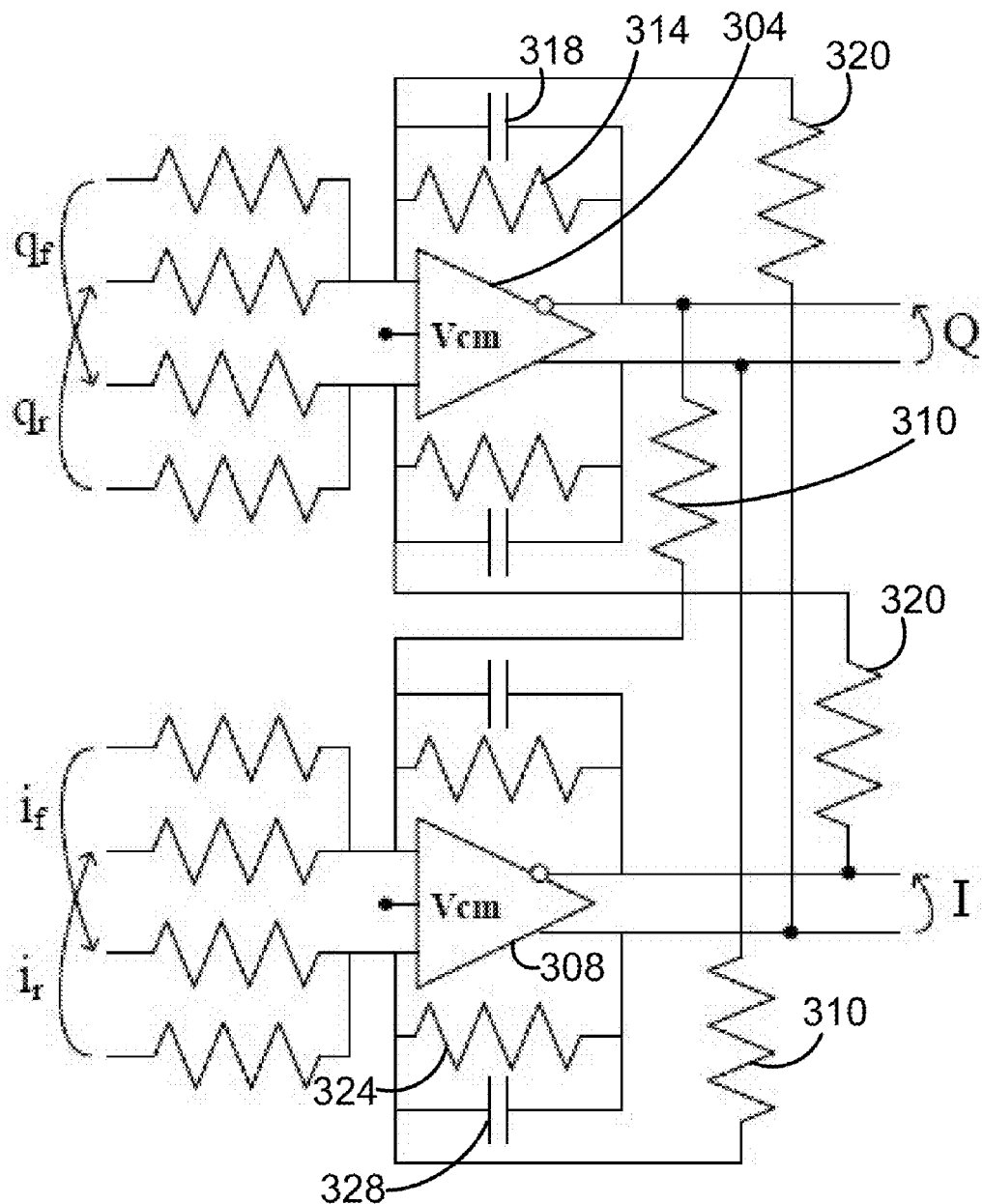
FIG. 3 shows the architecture of polyphase difference amplifiers.

FIG. 3 shows the architecture of the polyphase difference amplifier that may be used as a complex band pass error amplifier in a preferred embodiment of the invention. The cross coupled polyphase amplifier illustrated in FIG. 3 comprises a first fully differential amplifier 304 and a second fully differential amplifier 308. A signal proportional to the output from the first fully differential amplifier 304 is provided through a network of resistors 310 as input to the second fully differential amplifier 308 and through a network of resistors 314 and capacitors 318 as input to the first fully differential amplifier 304. The output from the second fully differential amplifier 308 is provided through a network of resistors 320 as input to the first fully differential amplifier 304 and through a network of resistors 324 and capacitors 328 as input to the second fully differential amplifier 308.

The transfer function $H(\omega)$ in Eq. 1 describes the relationship between the complex output I+jQ and the complex input i+jq of the polyphase architecture. A complex signal is represented by two real signal paths in parallel. Hence the I and Q signals represent I+jQ. The transfer function is as described by Eq. 1 only if its active elements (such as the fully differential operational amplifiers in the discrete implementation) are ideal blocks of infinite gain and bandwidth, its passive components are perfectly matched, and the i and q input signals have the same amplitude and are in perfect quadrature.

$$H(\omega) = \frac{K}{1 + j\left(\frac{\omega + \omega_c}{\omega_o}\right)} \qquad \text{Eq. 1}$$

$K = R_F \cdot R_i^{-1}$, $\omega_c = (R_C \cdot C)^{-1}$, and $\omega_o = (R_F \cdot C)^{-1}$ are the peak gain, center frequency, and half width of the baseband signal band, respectively.

An equivalent representation of the operation of polyphase amplifiers can be obtained if one considers the four real input (i, q) to real output (I, Q) transfer functions, and obtain the overall complex response by appropriately combining these different functions. For a unity-gain polyphase difference amplifier, these four equations are $$i2I = \frac{I}{i} = \left(\frac{\omega_o}{j\omega} - \frac{\omega_o^2}{\omega^2}\right) \cdot \frac{1}{D} \qquad \text{Eq. 2a}$$

$$q2I = \frac{I}{q} = +\frac{\omega_o \cdot \omega_c}{\omega^2} \cdot \frac{1}{D} \qquad \text{Eq. 2b}$$

$$q2Q = \frac{Q}{q} = \left(\frac{\omega_o}{j\omega} - \frac{\omega_o^2}{\omega^2}\right) \cdot \frac{1}{D} \qquad \text{Eq. 2c}$$

$$i2Q = \frac{Q}{i} = -\frac{\omega_o \cdot \omega_c}{\omega^2} \cdot \frac{1}{D} \qquad \text{Eq. 2d}$$

where $$D = \left(1 - \frac{\omega_o^2 + \omega_c^2}{\omega^2} + \frac{2\omega_o}{j\omega}\right) \qquad \text{Eq. 2e}$$

This last approach to the understanding of how polyphase amplifiers work is useful because it allows us to derive the equations that separate the desired and undesired baseband components of the output response.

Let $U_p$ be the positive-frequency output complex signal for a positive-frequency input complex signal, $$U_p = (i2I - j \cdot q2I) + j \cdot (i2Q - j \cdot q2Q),$$

$V_p$ is the negative-frequency output for positive-frequency input (aka the "mirror" of the desired signal), $$V_p = (i2I - j \cdot q2I) - j \cdot (i2Q - j \cdot q2Q)$$

$V_m$ is the negative-frequency output for negative-frequency input, $$V_m = ((i2I - j \cdot q2I) - j \cdot (i2Q - j \cdot q2Q))^*$$

and $U_m$ be the positive-frequency output signal for a negative-frequency input signal (aka the "mirror" of the undesired signal).

$$U_m = ((i2I - j \cdot q2I) + j \cdot (i2Q - j \cdot q2Q))^*$$

When the polyphase amplifier described by Eq.'s 2 a-d is used as the difference amplifier of a Cartesian feedback control system, the baseband control bandwidth is frequency-offset to the positive axis. Thus in the presence of an error-free down-mixer in the control loop, the feedback input will always be composed of positive frequencies only and the only components of interest in the overall amplifier response are those described by $U_p$ and $V_p$. However, if the down-mixer introduces quadrature mismatches and DC-offsets, negative (mirror) frequencies and DC components will also be generated at the feedback input of the polyphase difference amplifiers. When considering quadrature errors, the worst situation exists when the down-mixer creates positive and negative frequencies of the same amplitude from a single positive-frequency signal, such as in the case of ϕ equal to 45°. In this case, the analysis of all four components $U_p$, $V_p$, $U_m$, and $V_m$ becomes important and the ability of the polyphase amplifier to reject the undesired negative-frequency inputs becomes a figure of merit. In summary, in this case:

$U_p$ is the response of the polyphase amplifier that describes the positive output frequencies created by the positive-frequency input signals. It is the desired response to the desired reference signals, and the only response that ideal polyphase amplifiers have to the positive-frequency input signals.

$V_p$ is the response of the polyphase architecture that describes the negative output frequency response created by the positive-frequency input signals. In ideal polyphase architectures, this response is null. In real architectures, it is undesired since it creates unwanted frequencies.

$V_m$ is the response of the polyphase amplifier that describes the output negative frequencies created by the negative-frequency input signals. It is a "desired" response, in the sense that it must be expected from the perfect architecture, to the undesired negative-frequency input component. These frequencies are outside the control bandwidth and attenuated with respect to the desired positive frequencies as their amplitude relative to $U_p$ depends on the roll-off of the polyphase gain (that, in the first-order architecture of FIG. 3, is always equal to −20 dB/decade). Thus these frequencies are also not sustained by the loop operation.

$U_m$ is the response of the polyphase architecture that describes the positive output frequencies created by the negative-frequency input signals. In ideal polyphase architectures, this response is null. In real architectures, it is undesired since it creates unwanted frequencies that are indistinguishable from the desired output signal $U_p$. When the polyphase amplifier is used in control systems, these frequencies will always show at the input of the power amplifier, since they are inside the control bandwidth and are sustained by the loop operation. The ability of the complex band pass amplifiers to reject these frequencies is thus an important figure of merit and one that we aim to characterize to assess the feasibility of using in a Cartesian feedback system.

Figure 4A:
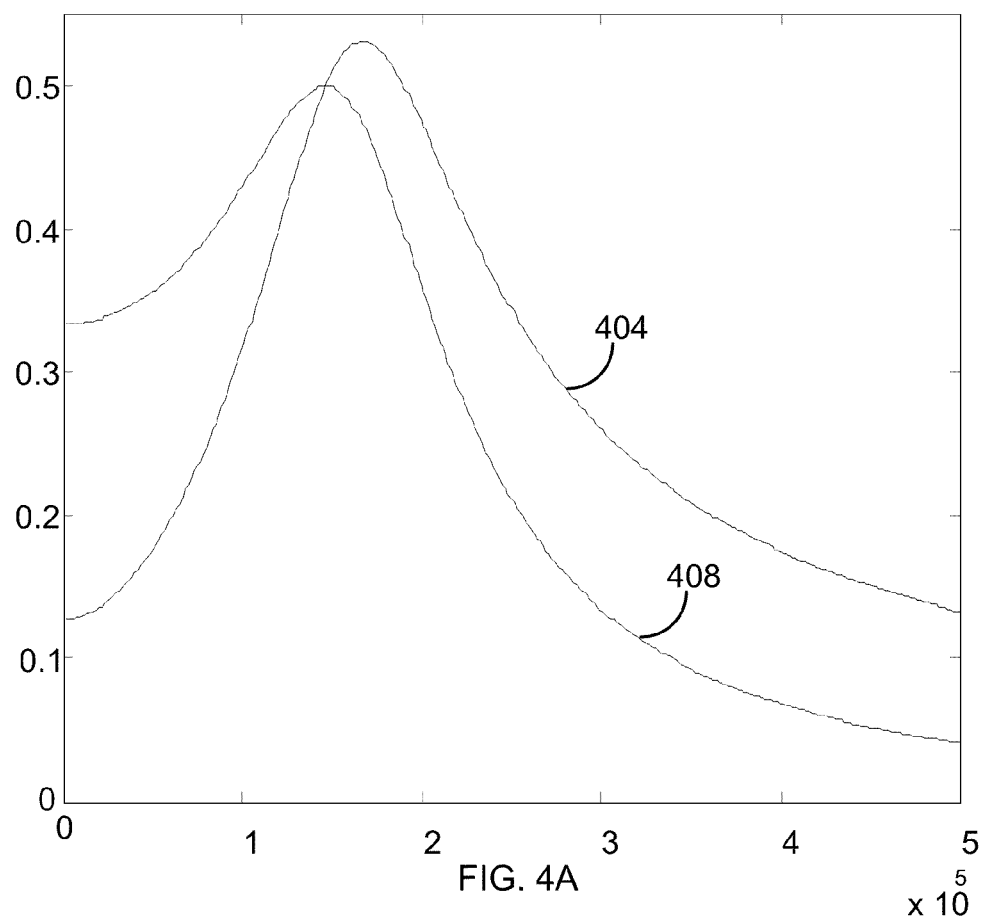
FIGS. 4A-C show the transfer functions i2I, i2Q, q2I, and q2Q, and the components of the output response $U_p$, $U_m$, $V_m$, and $V_p$, of a perfect polyphase architecture to the perfectly matched pair of reference quadrature signals whose frequency sweep includes both the positive and negative side of the complex spectrum.
Figure 4B:
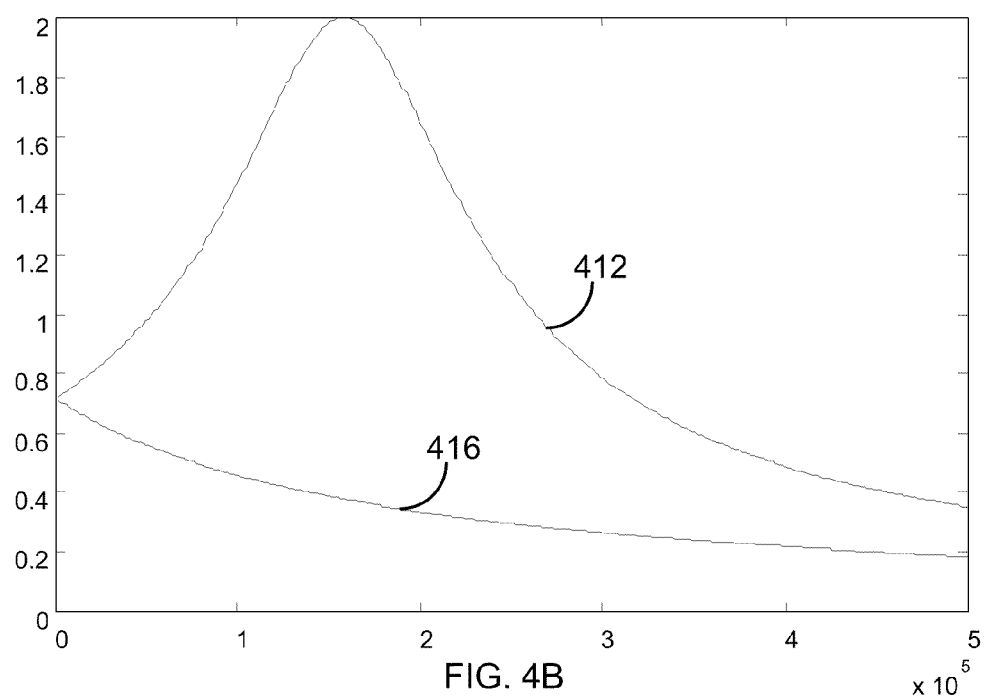
Figure 4C:
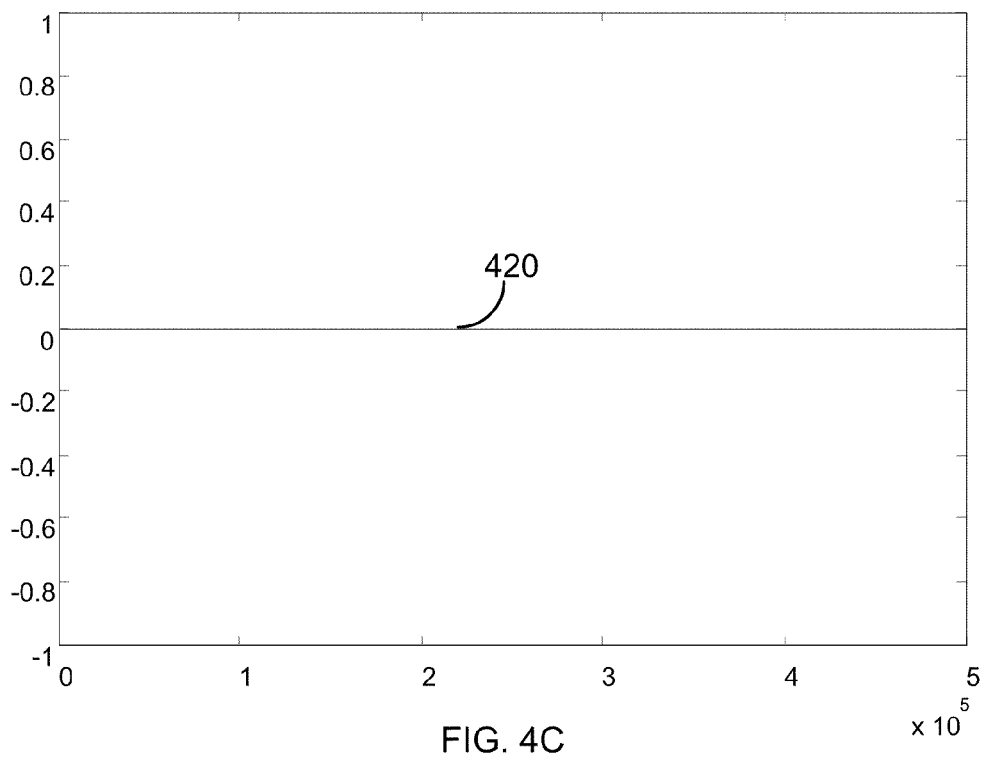
Figure 4D:
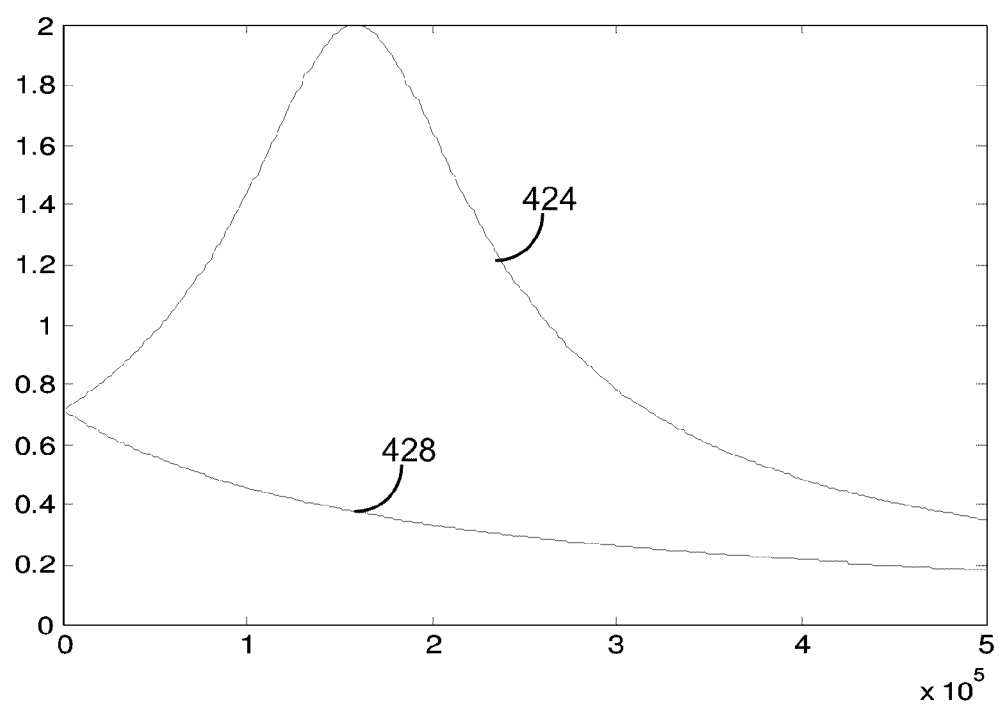
FIG. 4D shows the amplitude of the desired overall response, where the negative frequencies are folded in with the positive frequencies.

FIGS. 4A-C show the transfer functions i2I, i2Q, q2I, and q2Q, and the components of the output response $U_p$, $U_m$, $V_m$, and $V_p$, of a perfect polyphase architecture to the perfectly matched pair of reference quadrature signals whose frequency sweep includes both the positive and negative side of the complex spectrum. FIG. 4A shows the four transfer functions of a perfect polyphase amplifier. The q2Q matched and q2I matched curves are shown at 404. The i2I matched and i2Q matched curves are shown at 408. FIG. 4B shows the two desired components of the polyphase amplifier's response. $U_p$ matched is shown as curve 412. $V_m$ matched is shown as curve 416. FIG. 4C shows the two "mirror" components of the polyphase amplifier's response, where $V_p$ matched and $U_m$ matched are shown as line 420. As expected, the undesired $V_p$ and $U_m$ are null; $U_p$ is the desired response to the positive-frequency signals; $V_m$ is the desired response to the negative-frequency signals. The amplitude of the desired overall response is shown in FIG. 4D, which shows the overall up-converter response of the polyphase amplifier by showing $U_p$ matched as curve 424 and $V_m$ matched as curve 428, together with the amplitude of the undesired overall response (which we call the "mirror" response since it results from the folding or "mirroring" of a negative frequency input to a positive frequency output, and vice versa). The results of this analysis shows us that, for ideal polyphase amplifiers, the loop baseband control bandwidth can indeed be shaped so that: only positive (or negative) frequency quadrature baseband signals are amplified, while their mirrors (as can appear because of quadrature error in the mixer stage) are not; the negative (or positive) frequency quadrature signals that are not amplified do not produce any signals of opposite complex frequency.

In reality, one has to expect that imperfections of the polyphase architecture cause both positive and negative complex frequencies to be amplified as well as components of opposite complex frequency to be originated at the output.

In a discrete implementation, which is particularly appealing in the context of our application of frequency-offset Cartesian feedback to MRI power amplifiers, the major deviation from the ideal case is the mismatch of the capacitors. Consider a mismatch dC that affects the capacitors C of one fully differential amplifier relative to the other. In this case, the mismatch of the half-bandwidth $d\omega_o$ between the two channels is $$\frac{d\omega_o}{\omega_o} = \left(1 + \frac{dC}{C}\right)^{-1} - 1$$

and the transfer functions of the mismatched architecture become $$\frac{I}{i} = \left(\frac{\omega_o + d\omega_o}{j\omega} - \frac{\omega_o^2 - d\omega_o^2}{\omega^2}\right) \cdot \frac{1}{D^*}$$

$$\frac{I}{q} = \left(\frac{\omega_c \cdot \omega_o}{\omega^2} - \frac{\omega_c \cdot d\omega_o^2}{\omega_o \cdot \omega^2}\right) \cdot \frac{1}{D^*}$$

$$\frac{Q}{q} = \left(\frac{\omega_o - d\omega_o}{j\omega} - \frac{\omega_o^2 - d\omega_o^2}{\omega^2}\right) \cdot \frac{1}{D^*}$$

$$\frac{Q}{i} = -\left(\frac{\omega_c \cdot \omega_o}{\omega^2} - \frac{\omega_c \cdot d\omega_o^2}{\omega_o \cdot \omega^2}\right) \cdot \frac{1}{D^*}$$

-continued where $$D^* = \left(1 - \frac{\omega_o^2 + \omega_c^2 - d\omega_o^2 \cdot \left(1 + \frac{\omega_c^2}{\omega_o^2}\right)}{\omega^2} + \frac{2\omega_o}{j\omega}\right)$$

The simulated response of the polyphase amplifier with a capacitive mismatch of 0.85% will be discussed later, in comparison with the results of our experiments.

Methods

To validate the mathematical model described above and demonstrate that discrete polyphase amplifiers can have the performance required to be used as components of Cartesian feedback systems, a printed circuit board polyphase amplifier was created using a PCB hosting a polyphase amplifier that can be driven in one of three different ways:

with four single-ended independent inputs
with two fully-differential independent inputs
with two independent (positive) inputs, the other two (negative) inputs being AC grounded.

The board allows bench testing of polyphase amplifiers built using discrete passive components of known tolerance and discrete fully-differential amplifiers of known (nominal) GBP.

Figure 5:
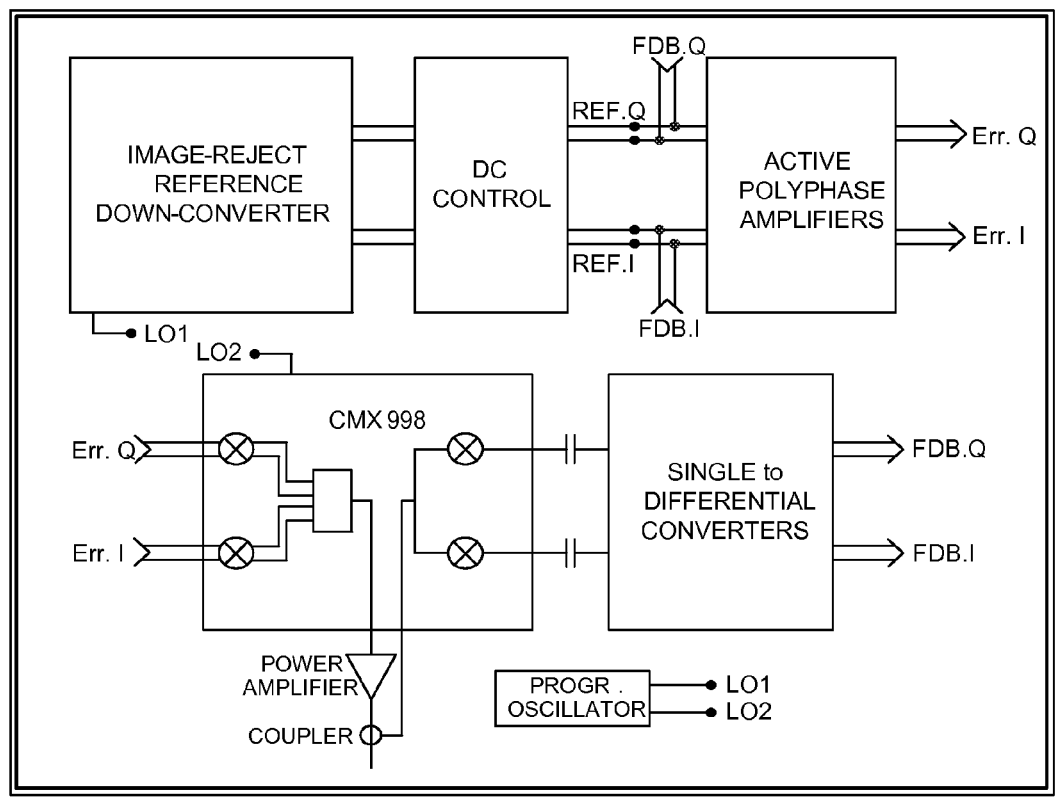
FIG. 5 shows a simplified block diagram of an example of implementation (or, embodiment) of the invention.

To demonstrate the feasibility of frequency-offset Cartesian Feedback methods based on polyphase amplifiers, an embodiment of the invention was created using a PCB hosting all the essential blocks to control an external amplifier (with the sole exception of the coupler that samples a signal proportional to the amplifier output): image-reject baseband reference down-converter; polyphase difference amplifiers; CMX998 transmitter (made by CML Microcircuit of Winston Salem, N.C.), which integrates mixers and the phase shifter; circuitry to manage the DC- or AC-coupling of the feedback signals (both approaches are possible); circuitry to convert the single-ended feedback signals from the down-mixer to differential; programmable local oscillator; and linear regulators. A simplified block diagram of the board is shown in FIG. 5. Digital serial control is provided for: (a) adjusting the loop phase, (b) enabling the up-mixer and down-mixer, (c) selecting the up-mixer and down-mixer gains. Manual control with on-board trimmers is provided for (d) adjusting the I,Q DC offsets.

Experiments

On the Polyphase Amplifiers

The experiments described below were obtained by driving the polyphase amplifiers with four single-ended independent inputs (i+, i−, q+, and q−) and measuring the four single-ended outputs elicited by each input (I+, I−, Q+, Q−). Appropriately combining these 16 measurements obtains the transfer functions i2I, i2Q, q2I and q2Q and the output components $U_p$, $U_m$, $V_p$, and $V_m$, which were described above, as well as their combination into the overall desired and undesired responses.

On the Frequency Offset Cartesian Feedback

The first fundamental test was to characterize the open loop behavior of the frequency-offset Cartesian feedback system. The RF input of the down-mixer was driven with a 2 MHz sweep, centered at 64 MHz (the local oscillator frequency), from a Network Analyzer. The down-mixed signal, first converted from single-ended to differential, was compared by the polyphase amplifiers to a null reference baseband signal and amplified. The output of the polyphase baseband amplifiers was up-mixed by the up-mixer and was used to drive a 200 W power amplifier. The input of the Network Analyzer was the sampled output voltage of the power amplifier with 50 ohm dummy load. Using computer serial interface, we were able to change the CMX998 integrated attenuators and phase shift, thus changing both amplitude and phase of the loop gain.

Results

On the Polyphase Amplifiers

We measured the response of our discrete polyphase amplifiers on the bench for different values of capacitive matching as well as at different values of the center frequency of the polyphase passband, and compared these measurements to the results of simulations obtained using the mathematical model described in the previous sections.

In a first experiment, we chose the components of our discrete polyphase circuit to obtain 0.85% mismatch dC/C of the capacitors, peak gain of 40 dB, and center frequency of nearly 200 KHz. We chose the fully differential discrete operational amplifiers with part number LT1994 by Linear Technology of Milpitas Calif., whose gain-bandwidth product (GBP) of 70 MHz makes it possible to accurately implement the desired amplitude and shape of the polyphase passband. The passive resistors were hand selected to achieve 0.01% matching. The simulated transfer functions and output response were calculated using our model with a 0.85% mismatch dC/C between capacitors and the same values of peak gain and center frequency. The normalized results of these simulations were compared with the normalized results of the experiments.

Figure 6A:
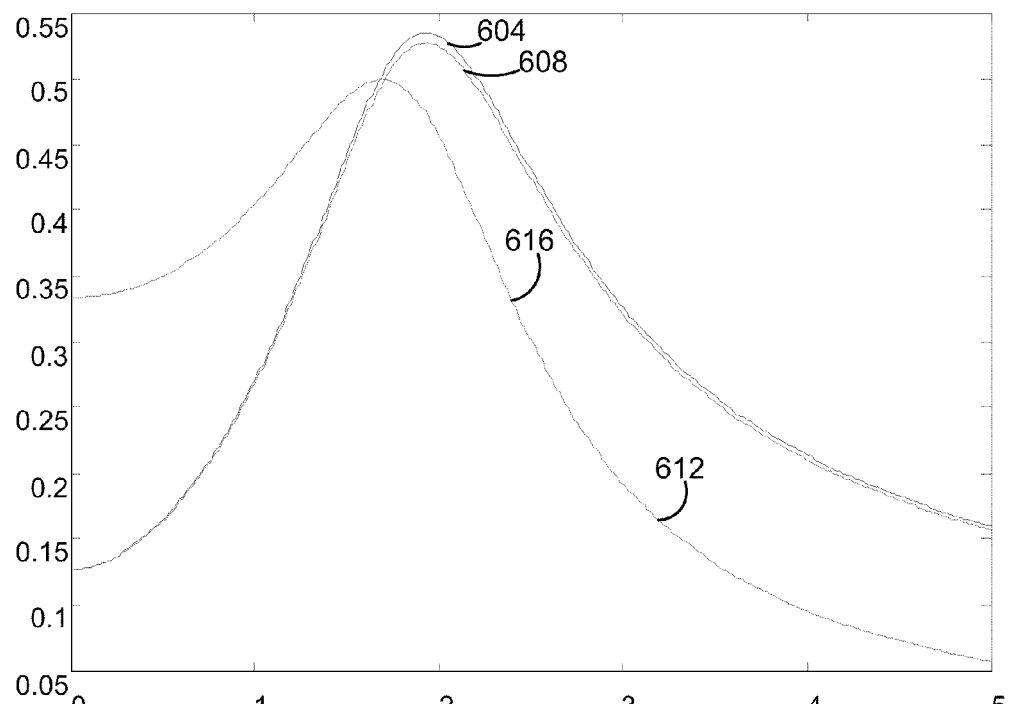
FIGS. 6A and B compare simulated and measured transfer functions i2Q, i2I, q2I, q2Q with known mismatches.
Figure 6B:
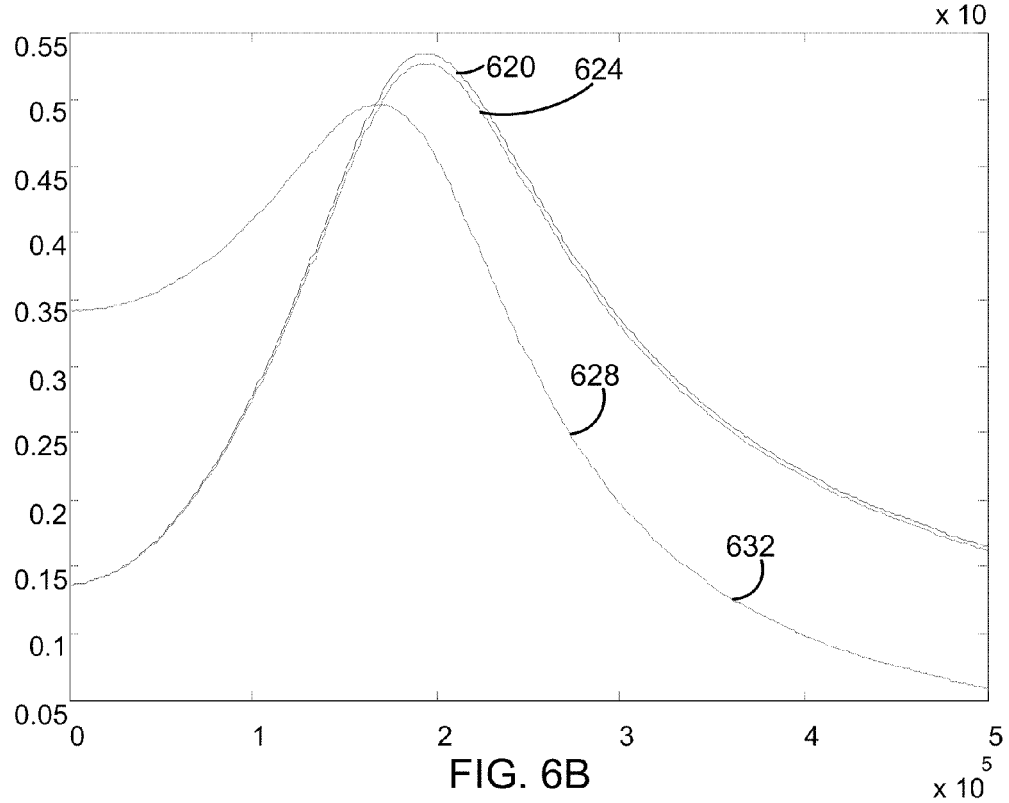
Figure 7A:
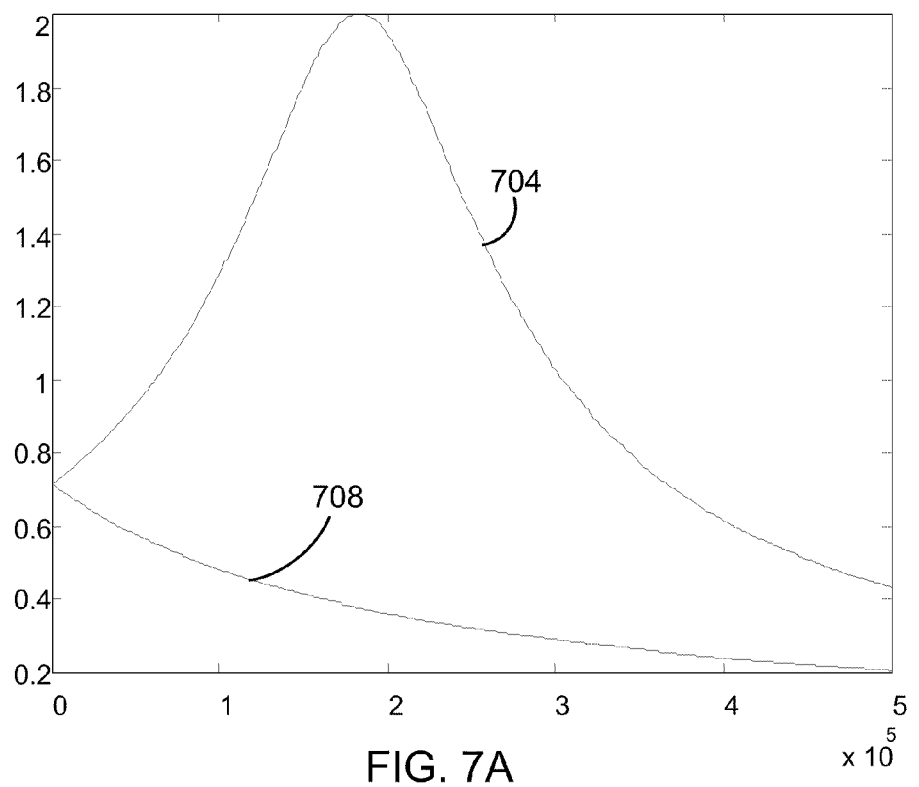
FIGS. 7A-B show simulated and measured desired responses $U_p$ and $V_m$ with known mismatches.
Figure 7B:
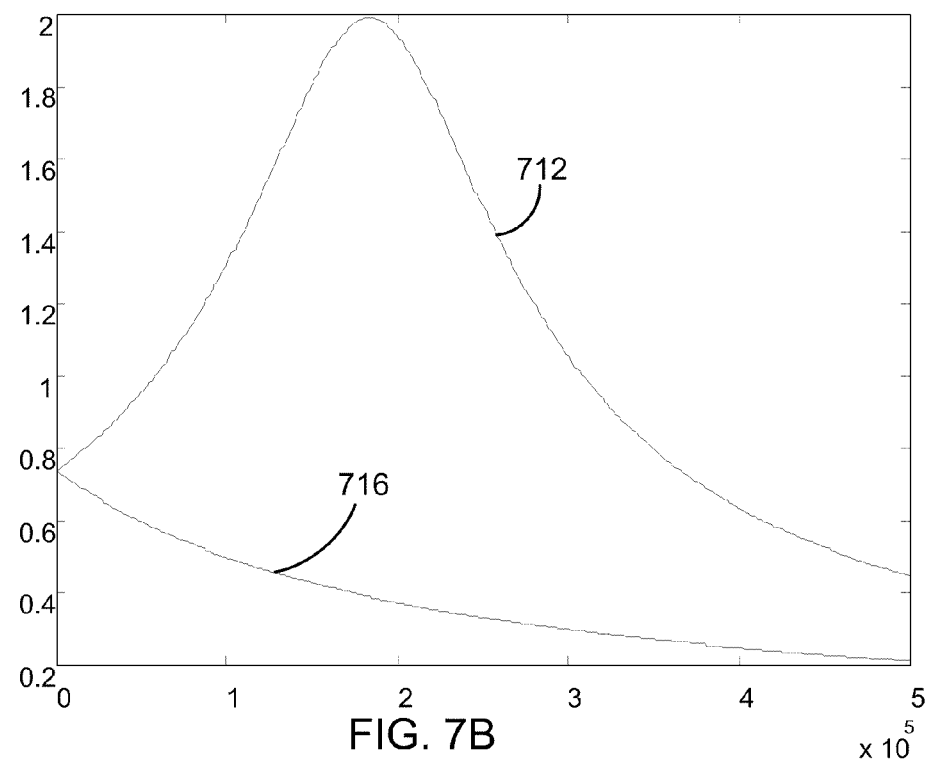

FIGS. 6A and B compare simulated and measured transfer functions i2Q, i2I, q2I, q2Q. FIG. 6A shows a simulated q2Q with mismatch curve 604, a simulated i2I with mismatch curve 608, a simulated i2Q with mismatch curve 612, and a simulated q2I with mismatch curve 616. The simulated i2Q with mismatch curve 612 and the simulated q2I with mismatch curve 616 are nearly identical, so that they appear as a single curve. FIG. 6B shows a measured q2Q curve 620, a measured i2I curve 624, a measured i2Q curve 628, and a measured q2I curve 632. The measured i2Q 628 and the measured q2I 632 are near identical, so that they appear as a single curve. FIGS. 7A-B show simulated and measured desired responses $U_p$ and $V_m$. FIG. 7A shows the simulated desired responses $U_p$ and $V_m$ with a simulated $U_p$ with mismatch curve 704 and a simulated $V_m$ with mismatch curve 708. FIG. 7B shows measured desired responses $U_p$ and $V_m$ with a measured $U_p$ curve 712 and a measured $V_m$ curve 716.

Figure 8A:
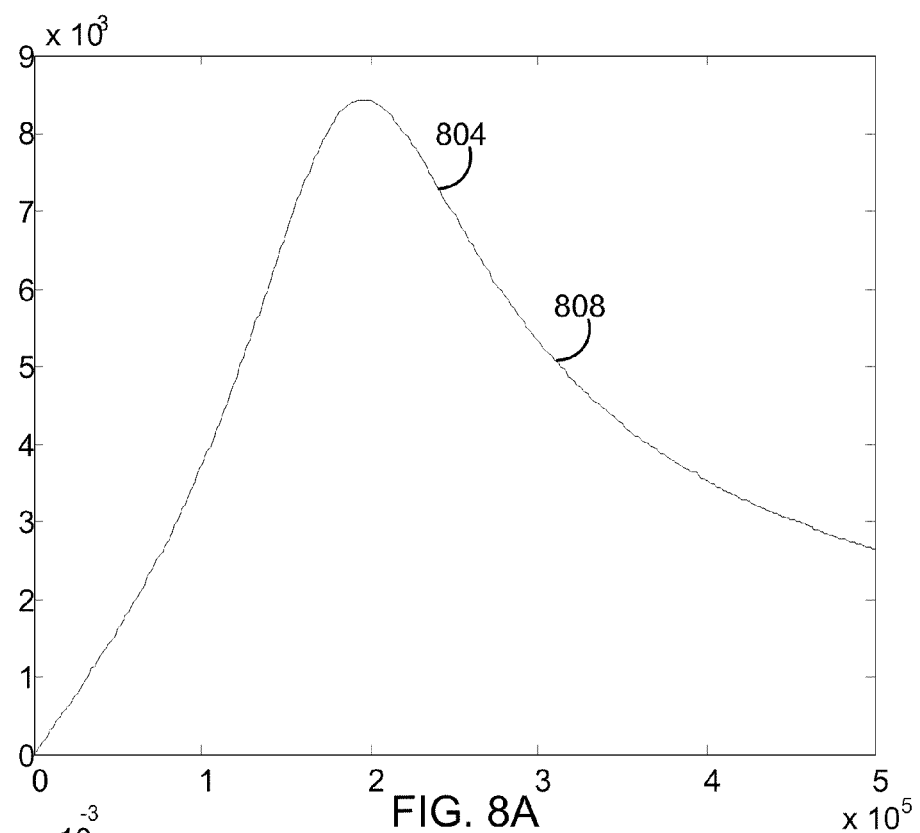
FIGS. 8A-B show simulated and measured undesired responses $V_p$ and $U_m$ with known mismatches.
Figure 8B:
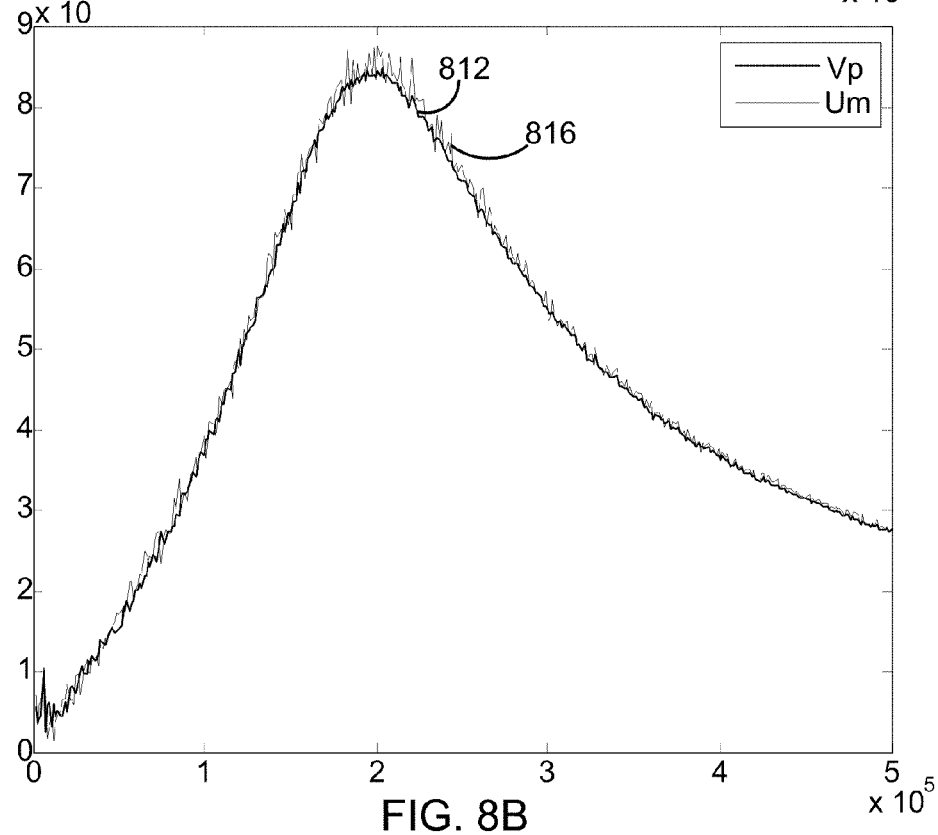

FIGS. 8A-B show simulated and measured undesired responses $V_p$ and $U_m$. FIG. 8A shows the simulated undesired responses with simulated curve $V_p$ with mismatch 804 and simulated curve $U_m$ with mismatch 808. Simulated curve $V_p$ with mismatch 804 and simulated curve $U_m$ with mismatch 808 are nearly identical and therefore appear as a single curve. FIG. 8B shows the measured undesired responses with a measured curve $V_p$ 812 and a measured curve $U_m$ 816.

Figure 9A:
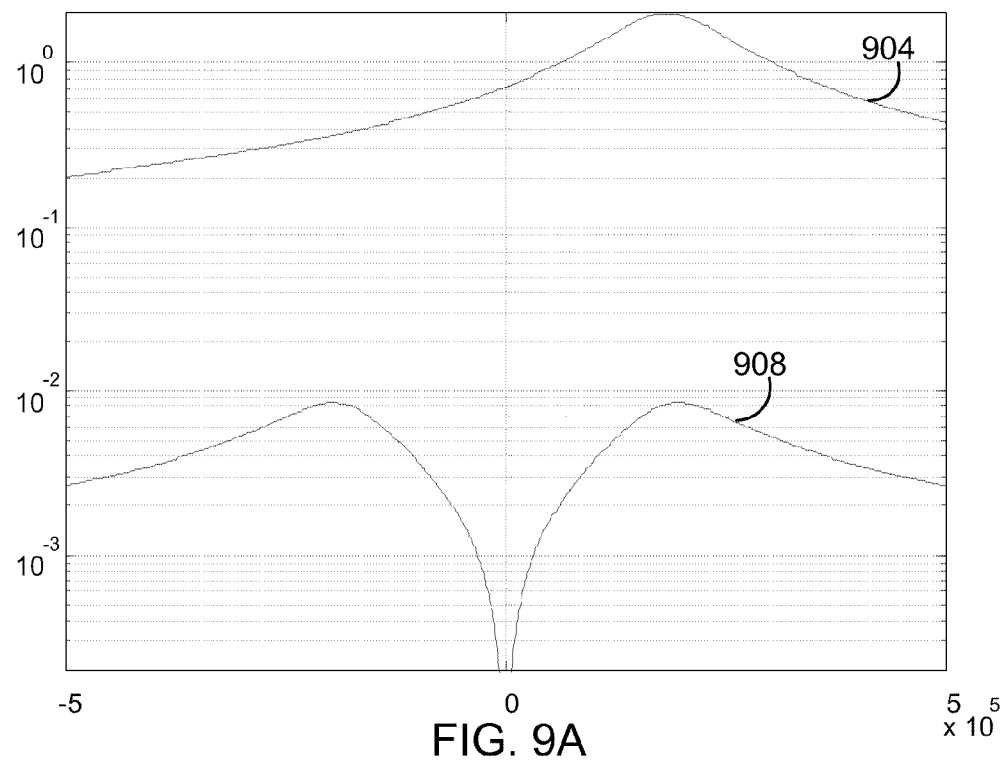
FIGS. 9A-B show simulated and measured overall up-converted desired and mirror responses with known mismatches.
Figure 9B:
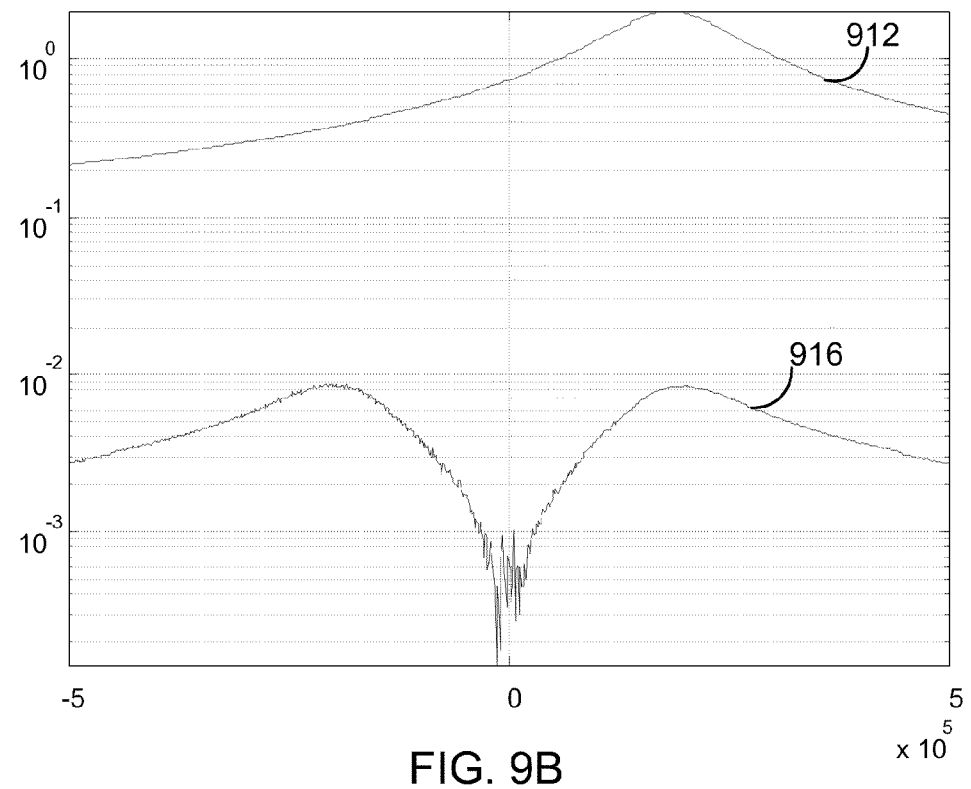

FIGS. 9A-B show simulated and measured overall up-converted desired and mirror responses. FIG. 9A shows simulated overall up-converted desired and mirror responses, with a desired frequency response with mismatch curve 904 and a mirror frequency response with mismatch curve 908. FIG. 9B shows measured overall up-converted desired and mirror responses, with a desired frequency response curve 912 and a mirror frequency response curve 916. These figures show that the results of our experiments agree very well with the results of our simulations, thereby demonstrating the validity of the model. Both results show that a 0.85% capacitor matching provides about 47 dB double-sideband image rejection.

We also conducted experiments with 0.05% capacitor matching and center frequencies up to 1.65 MHz. At center frequencies over 650 KHz, we substituted the LT1994 (GBP 70 MHz) by Linear with THS4141 (GBP 200 MHz) by Texas Instruments a Delaware Corporation, to faithfully reproduce the desired amplitude and shape of the polyphase passband. The peak gain was again equal to 100, the resistor matching to 0.01%. All of our experiments validate our model. As a result a greater than 60 dB (and up to 75 dB) of image rejection was obtained in all experiments, as well as the ability to move the complex band pass at the target frequency of 1.65 MHz.

On the Frequency Offset Cartesian Feedback

As measured during our first experiment, at full value of the CMX998 integrated gain and null phase shift, the peak gain amplitude is up to 400 at a frequency of 64.5 MHz. The integrated attenuators of the CMX998 can be controlled to decrease this value by 59 dB, of which 29 dB is in the feedback path (down-mixer) and 30 dB is in the forward path (up-mixer). Mostly the polyphase amplifier is responsible for shaping the phase characteristics of the loop, which is characterized by a well-behaved +/−90 degree phase swing in a nearly 250 KHz bandwidth near the peak gain frequency, as well as by a rate of change of the gain amplitude near this frequency equal to −20 dB/decade.

Figure 10:
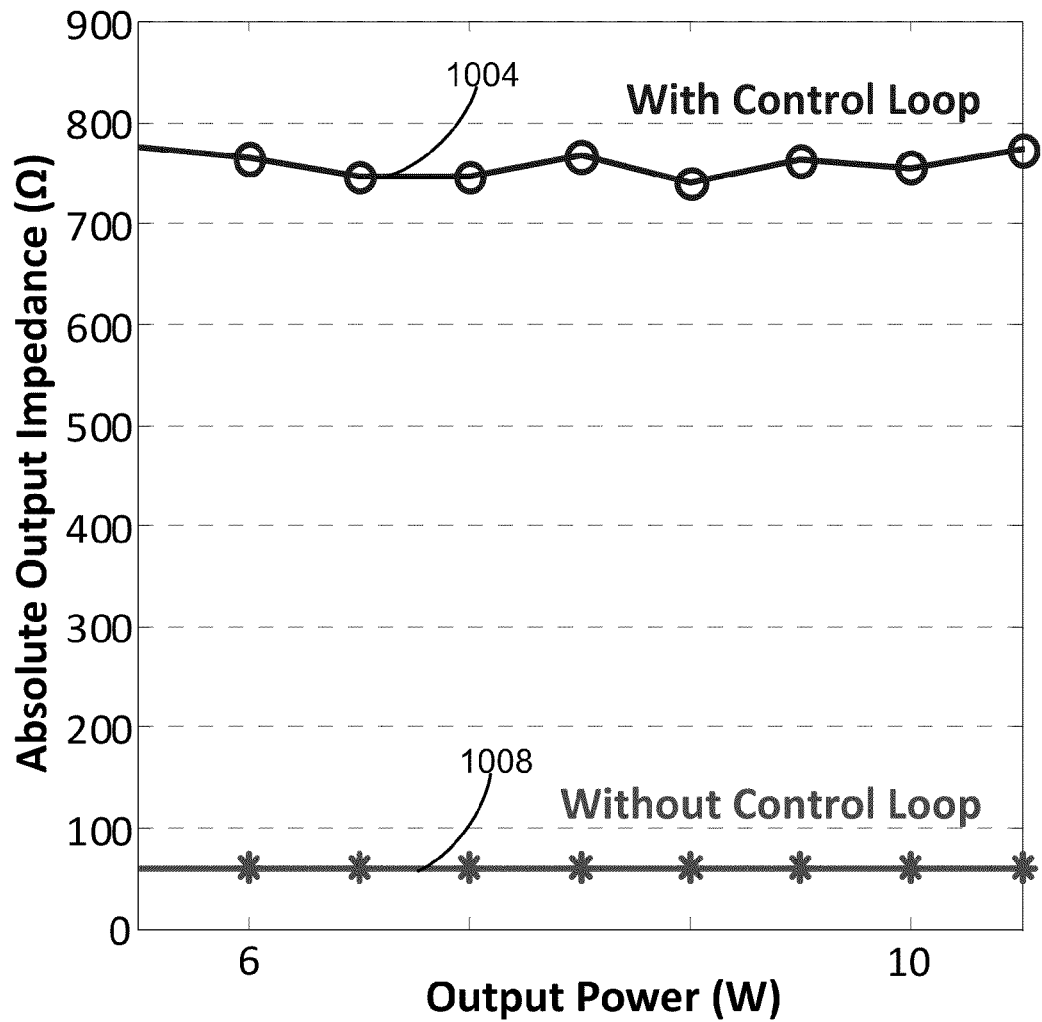
FIG. 10 is a graph of an absolute output impedance with respect to output power with a control loop and an absolute output impedance with respect to output power without a control loop.

In our second experiment we found the closed loop to be stable within a range of phase shift values equal to 45 degree near 200 degrees. When the system is stable, the results of this experiment are summarized in FIG. 10, which shows an absolute output impedance with respect to output power with a control loop curve 1004 and an absolute output impedance with respect to output power without a control loop curve 1008. The experiment compares the measured output impedance of the power amplifier driven directly by a RF signal, to the measured output impedance of the same controlled by the Cartesian feedback system, at different levels of the output power. As can be seen, the output impedance is increased up to 15 times. This confirms that the effect of the closed loop is, as expected, to make it behave like a current source. The extent to which this result is achieved depends on the amplitude of the loop gain (the output impedance increases by this amount).

An embodiment of the invention provides frequency-offset Cartesian feedback based on polyphase difference amplifiers to control RF power amplifiers.

A mathematical model has been provided to separate and describe the desired and undesired response of the polyphase amplifiers to both positive and negative frequencies.

An implementation of the invention has demonstrated that polyphase difference amplifiers, even with discrete implementations, can achieve up to 70 dB rejection of the mirror frequencies created by quadrature errors of the down-mixers in Cartesian feedback loop.

Figure 11:
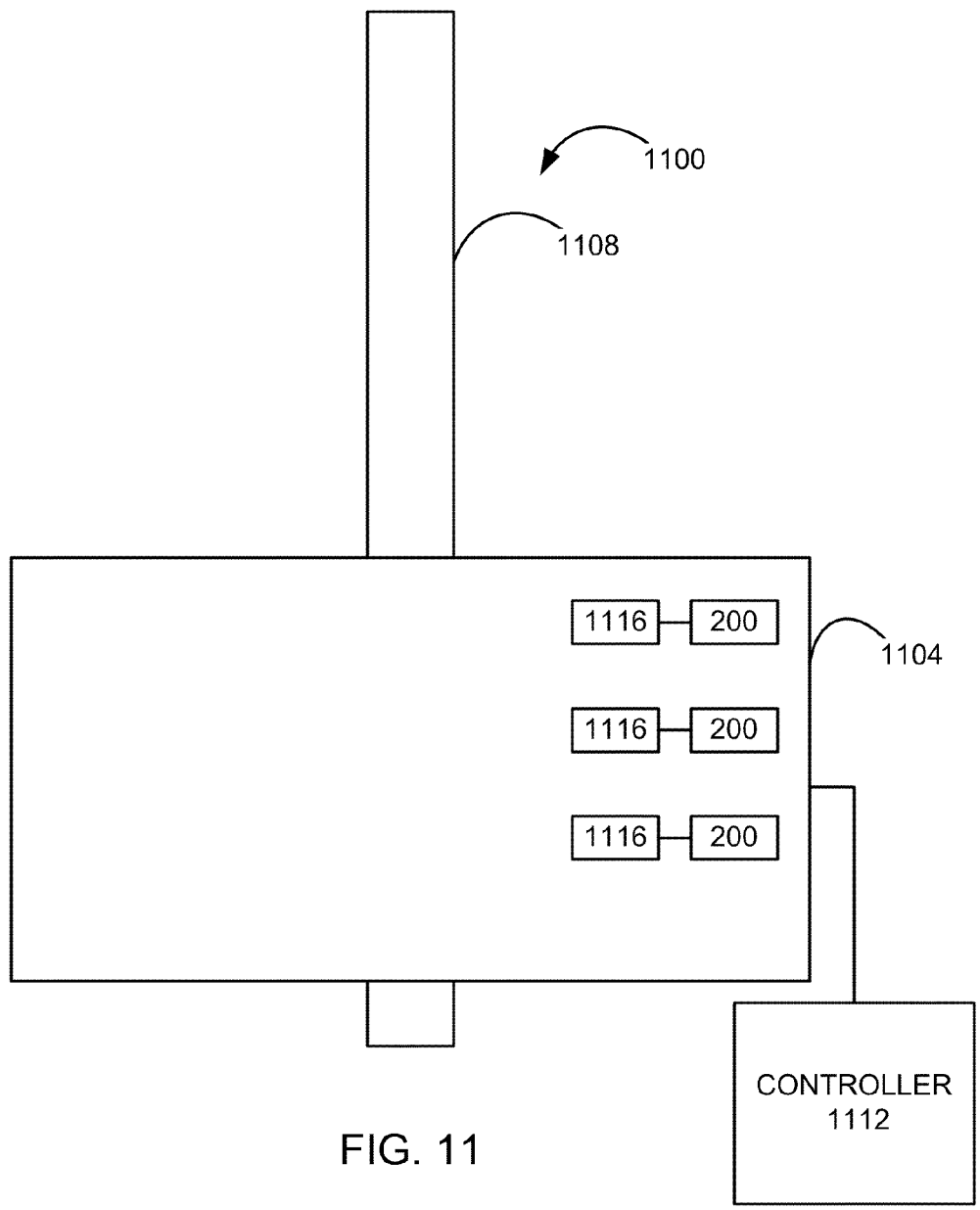
FIG. 11 is a schematic top view of a magnetic resonance imaging (MRI) system.

FIG. 11 is a schematic top view of a magnetic resonance imaging (MRI) system 1100 that may be used in an embodiment of the invention. The MRI system 1100 comprises a magnet system 1104, a patient transport table 1108 connected to the magnet system, and a controller 1112 controllably connected to the magnet system. In one example, a patient would lie on the patient transport table 1108 and the magnet system 1104 would pass around the patient. The controller 1112 would control magnetic fields and radio frequency (RF) signals provided by the magnet system 1104 and would receive signals from detectors in the magnet system 1104. The magnetic system 1104 comprises an array of coils 1116. In this example each coil 1116 is connected to an amplifier system 200 with Cartesian feedback as illustrated in FIG. 2, using a complex band pass filter. In another embodiment, a plurality of coils 1116 may be connected to a single amplifier system 200. The controller 1112 is controllably connected to the amplifier system 200. The coils may be excitation coils or imaging coils or both.

Figure 12A:
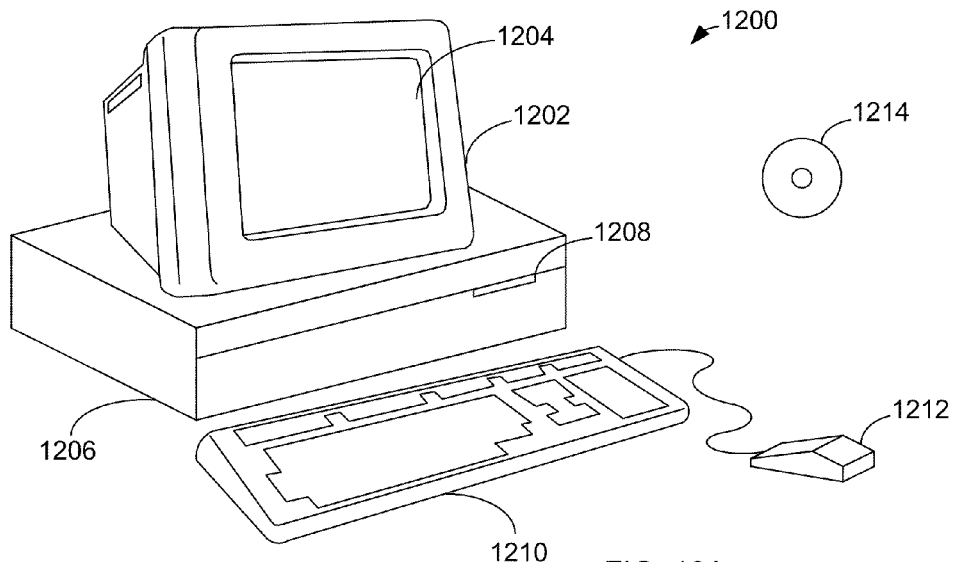
FIGS. 12A and 12B illustrate a computer system that may be used in an embodiment of the invention.
Figure 12B:
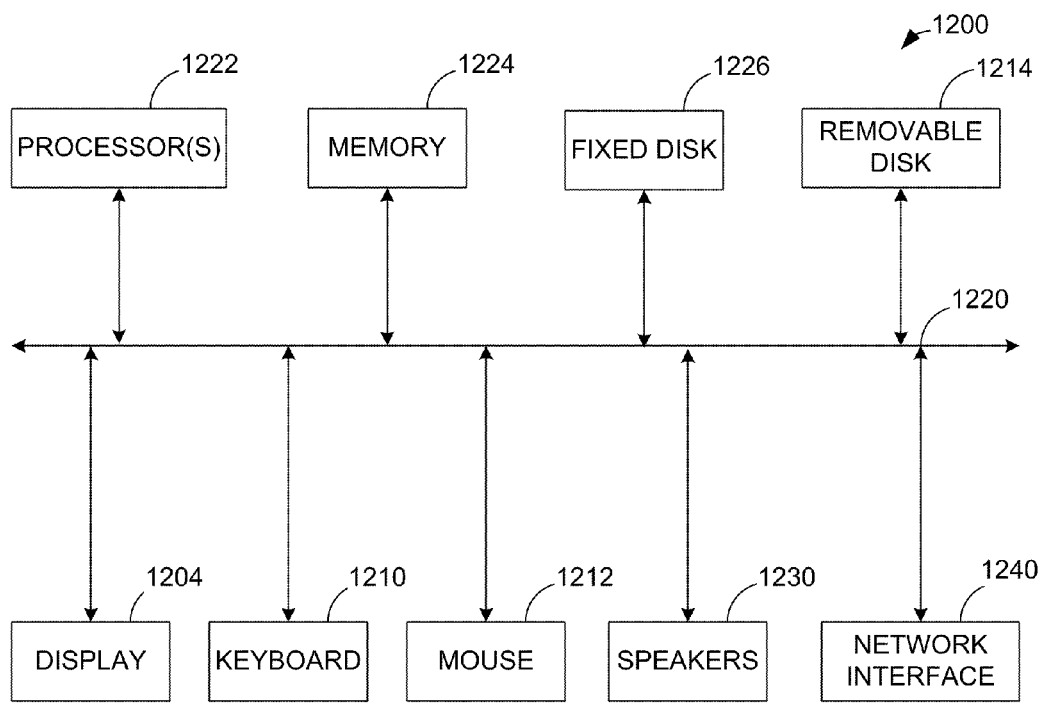

FIGS. 12A and 12B illustrate a computer system 1200, which is suitable for implementing a controller 1112 used in embodiments of the present invention. FIG. 12A shows one possible physical form of the computer system. Of course, the computer system may have many physical forms ranging from an integrated circuit, a printed circuit board, and a small handheld device up to a huge super computer. Computer system 1200 includes a monitor 1202, a display 1204, a housing 1206, a disk drive 1208, a keyboard 1210, and a mouse 1212. Disk 1214 is a computer-readable medium used to transfer data to and from computer system 1200.

FIG. 12B is an example of a block diagram for computer system 1200. Attached to system bus 1220 are a wide variety of subsystems. Processor(s) 1222 (also referred to as central processing units, or CPUs) are coupled to storage devices, including memory 1224. Memory 1224 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 1226 is also coupled bi-directionally to CPU 1222; it provides additional data storage capacity and may also include any of the computer-readable media described below. Fixed disk 1226 may be used to store programs, data, and the like and is typically a secondary storage medium (such as a hard disk) that is slower than primary storage. It will be appreciated that the information retained within fixed disk 1226 may, in appropriate cases, be incorporated in standard fashion as virtual memory in memory 1224. Removable disk 1214 may take the form of the computer-readable media described below.

CPU 1222 is also coupled to a variety of input/output devices, such as display 1204, keyboard 1210, mouse 1212, and speakers 1230. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, printers or other computers. CPU 1222 optionally may be coupled to another computer or telecommunications network using network interface 1240. With such a network interface, it is contemplated that the CPU might receive information from the network, or might output information to the network in the course of performing the above-described method steps. Furthermore, method embodiments of the present invention may execute solely upon CPU 1222 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In embodiments using an RF input, a quadrature demodulator and optional image reject filter, such as the one shown in FIG. 1 for the Reference Signals, may be used to generate the quadrature reference signal from a single ended radio frequency reference signal. Such a quadrature demodulated signal would be connected to the complex band pass error amplifier to provide the reference input signal.

FIG. 13 is a graph of a measured open loop gain of the prior art Cartesian feedback system without DC trimming, which shows LO leakage at the key peak frequency. FIG. 14 is a graph of a measured open loop gain of Cartesian feedback system with an embodiment of the invention without DC trimming and with AC coupling, which shows that the key peak frequency has been moved so that the LO leakage is outside of the MRI transmit bandwidth. This shows how the invention is able to remove LO leakage from the measured signal. Other combinations of DC trimming and/or DC or AC coupling are possible in the feedback loop in various embodiments of the invention.

In another embodiment the reference signal is grounded.

In one embodiment the complex band pass error amplifier is a differential amplifier system. In another embodiment the complex band pass error amplifier is a single ended construction.

In one embodiment the cross coupled polyphase amplifier comprises at least two amplifiers that are cross connected with a network incorporating capacitors and digitally adjustable variable resistors.

In another embodiment, the complex band pass error amplifier is implemented digitally using analog to digital converters to convert the reference analog input and quadrature demodulated amplifier signal, and a digital to analog converter to provide the output to the quadrature up converter with the complex band pass error response computed digitally by a digital signal processing (DSP) device or programmable logic device such as a field programmable gate array (FPGA), or complex programmable logic device (CPLD).

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. An amplifier system, comprising:
   a complex band pass error amplifier;
   a quadrature up converter connected to the complex band pass error amplifier so as to receive as input, output from the complex band pass error amplifier;
   an amplifier connected to the quadrature up converter so as to receive as input, output from the quadrature up converter;
   a quadrature down converter connected at or beyond the amplifier output so as to receive as input a signal proportional to that delivered by the amplifier as output to a load, wherein the complex band pass error amplifier is connected to the quadrature down converter so as to receive as a first input, output from the quadrature down converter and as a second input, a quadrature reference signal.

2. The amplifier system, as recited in claim 1, wherein the complex band pass error amplifier is a cross coupled polyphase amplifier.

3. The amplifier system, as recited in claim 2, further comprising a coupler connected between the amplifier output and quadrature down converter to sample the amplifier output signal to the load and provide the sampled output to the quadrature down converter.

4. The amplifier system, as recited in claim 3, further comprising a quadrature demodulator connected to the complex band pass error amplifier to generate the quadrature reference signal from a single ended radio frequency reference signal.

5. The amplifier system, as recited in claim 4, wherein the cross coupled polyphase amplifier comprises at least two amplifiers that are cross connected together.

6. The amplifier system, as recited in claim 5, wherein the complex band pass error amplifier can be fully differential or single ended in construction.

7. The amplifier system, as recited in claim 4, wherein the cross coupled polyphase amplifier comprises at least two amplifiers that are cross connected with a network incorporating capacitors and digitally adjustable variable resistors.

8. The amplifier system, as recited in claim 4, further comprising a magnetic resonance imaging coil connected to the amplifier, to receive as input, output from the amplifier.

9. The amplifier system, as recited in claim 3, wherein the reference signal is grounded.

10. The amplifier system as recited in claim 4, wherein the complex band pass error amplifier is implemented digitally using analog to digital converters to convert the reference analog input and the quadrature demodulated amplifier signal, and a digital to analog converter to provide the output to the quadrature up converter, with the complex band pass response computed digitally by DSP, FPGA, or CPLD.

11. An array of amplifiers incorporating at least one of the amplifier systems as recited in claim 1.

12. The amplifier system, as recited in claim 10, further comprising a magnetic resonance imaging coil connected to the amplifier, to receive as input, output from the amplifier.

13. The amplifier system as recited in claim 1, further comprising a phase shifter providing input to the quadrature up converter and quadrature down converter.

14. The amplifier system, as recited in claim 13, further comprising a local oscillator providing input to the phase shifter.

15. A method for providing linearized Cartesian feedback amplification, comprising:
   providing a quadrature reference signal as input to a complex band pass error amplifier;
   providing output from the complex band pass error amplifier to a quadrature up converter;
   up converting the output from the complex band pass error amplifier by a factor;
   providing output from the quadrature up converter to an amplifier, which amplifies the output from the quadrature up converter;
   receiving as input a signal proportional to a signal delivered by the amplifier as output to a load to a quadrature down converter;
   down converting the input signal by the factor;
   providing the down converted input signal as input to the complex band pass error amplifier.

16. The method, as recited in claim 15, further comprising providing output from a phase shifter as input to the up converter and the quadrature down converter.

17. The method, as recited in claim 16, further comprising providing as input to the phase shifter, output from a local oscillator.

18. The method, as recited in claim 15, wherein the complex band pass error amplifier is a cross coupled polyphase amplifier.

* * * * *